(12) United States Patent
Becca et al.

(10) Patent No.: US 7,062,601 B2
(45) Date of Patent: Jun. 13, 2006

(54) METHOD AND APPARATUS FOR INTERCONNECTING CONTENT ADDRESSABLE MEMORY DEVICES

(75) Inventors: Oswald Becca, Round Rock, TX (US); Alan Roth, Austin, TX (US); Robert McKenzie, Ottawa (CA)

(73) Assignee: Mosaid Technologies Incorporated, Kanata (CA)

( * ) Notice: Subject to any disclaimer, the term of this patent is extended or adjusted under 35 U.S.C. 154(b) by 316 days.

(21) Appl. No.: 10/430,378

(22) Filed: May 7, 2003

(65) Prior Publication Data

US 2004/0001380 A1    Jan. 1, 2004

Related U.S. Application Data

(60) Provisional application No. 60/391,941, filed on Jun. 28, 2002.

(51) Int. Cl.
*G06F 12/00* (2006.01)
(52) U.S. Cl. ...................................................... 711/108
(58) Field of Classification Search ................ 711/108; 707/6; 365/49
See application file for complete search history.

(56) References Cited

U.S. PATENT DOCUMENTS

| 6,253,284 | B1 | 6/2001 | Hsu |
| 6,317,350 | B1 | 11/2001 | Pereira et al. |
| 6,763,426 | B1 * | 7/2004 | James et al. ................. 711/108 |
| 6,775,166 | B1 * | 8/2004 | McKenzie et al. ............. 365/49 |
| 6,876,558 | B1 * | 4/2005 | James et al. ................... 365/49 |
| 2003/0065880 | A1 * | 4/2003 | Gordon et al. ............... 711/108 |

* cited by examiner

*Primary Examiner*—Hiep T. Nguyen
(74) *Attorney, Agent, or Firm*—Anne Kinsman; Borden Ladner Gervais LLP

(57) ABSTRACT

A cam system comprising a plurality of CAM devices connected in a serial cascade arrangement, the CAMS in the cascade being connected to an adjacent CAM by a respective forwarding bus, with at most a first CAM in the cascade being connected to a receive data signals from a host controller and at most a last CAM devices being coupled to forward results back to the host controller; and a send signal generation means for supplying a SEND signal to the last CAM; the SEND signal for co-ordinating transfer of the search result from the last CAM to the host controller, the serial cascade arrangement minimising the number of CAMs being connected to a common forwarding bus.

32 Claims, 12 Drawing Sheets

METHOD AND APPARATUS FOR INTERCONNECTING CONTENT ADDRESSABLE MEMORY DEVICES

This application claims priority from U.S. Provisional Application Ser. No. 60/391,941 filed Jun. 28, 2002.

The present invention relates to a content addressable memory (CAM) system, and in particular to a system and method for cascading a plurality of CAM devices to provide an increase in addressable memory space.

BACKGROUND OF THE INVENTION

In conventional memory systems, such as a Random Access Memory (RAM) memory cells are accessed by a processor that specifies a storage address that is associated with the given set of memory cells. This system provides rapid access to any portion of the memory system within certain limitations.

In associative memory systems, such as Content Addressable Memory (CAM), the system has the ability to perform a search and compare operation based on the contents of its memory cells, such that a storage address is retrieved by simultaneously searching all memory cells for a particular bit sequence. In other words user-specified data in a comparand register is compared directly with all the stored data held in the CAM's address space simultaneously. The CAM then generates a match or mismatch result, the former including an address of the memory cells at which the match occurred.

When storage requirements exceed the number of entries that may be stored on a single CAM device, multiple devices can be cascaded together to expand the number of search entries. This can be achieved, by employing well known methods for connecting a plurality of CAMs, such as daisy chain or multi-drop cascading methods. The cascaded devices may then be searched as a single entity.

In using these well-known methods, a plurality of CAMs are connected to a host controller. However, because search data must be applied to all CAMs in the cascade, long interconnects, typically arising from use of common forwarding buses, between the host controller and the cascade of CAMs introduce delay into the propagated signals. As the number of CAMs connected to a common forwarding bus from a host controller is increased, latency time for signals propagated on the bus becomes longer due to increased load capacitance and resistance. Thus the overall speed of the cascaded CAM structure is limited. These long interconnect delay problems become especially pronounced as individual CAMs capable of operating at high clock speeds, typically 75 MHz or faster, are becoming available.

Also, like in single CAM devices, multiple matches can exist in a cascaded CAM system, and accordingly a priority determining mechanism must be employed to resolve multiple match instances in a cascade arrangement.

A need therefore exists for an improved method and system for cascading a plurality of CAMs which reduces the delay time for signals propagated along the forwarding bus.

SUMMARY OF THE INVENTION

The present invention seeks to provide an improved method and system for cascading a plurality of CAMs.

In accordance with one aspect of the invention there is provided a cascaded content addressable memory (CAM) apparatus having a host controller, a plurality of n CAM devices and a plurality of forwarding buses for coupling a first CAM in the plurality of n CAM devices to the host controller and coupling the first CAM to a second through nth CAM devices to form a cascade chain of CAM devices. Each of the first through nth CAM devices are coupled via one of the plurality of forwarding buses.

In accordance with another aspect of the invention there is provided a content addressable memory (CAM) system having a plurality of CAM devices connected in a serial cascade arrangement, the CAM devices in the cascade being connected to adjacent CAM devices by a forwarding bus, with at most a first CAM in the cascade being connected to a receive data signals from a host controller.

In accordance with yet another aspect of the invention there is provided a method for searching a cascaded plurality of memory devices. Each memory device is capable of performing an search operation. The method involves receiving a search instruction and a search data key in a first memory device and initiating a first search operation in the first memory device. The search instruction and the search data key are forwarded to a subsequent memory device in the cascaded plurality of memory devices. A search operation is initiated, in turn, in each subsequent memory device, each time forwarding the search instruction and the search data key on to a subsequent memory device in the cascaded plurality of memory devices up to a last memory device.

b) an enable signal generator for supplying an enable signal to the last CAM; the enable signal initiating transfer of a search result from the last CAM back to the host controller.

An advantage of the present invention is that, delay caused by heavy loading on commonly connected buses to multiple CAMs is reduced.

Another advantage of the present invention is that reliance on additional circuitry, external to the CAMs, is minimised to resolve priority of received results from the cascaded CAMs.

BRIEF DESCRIPTION OF THE DRAWINGS

Embodiments of the invention may best be understood by referring to the following description and accompanying drawings wherein.

DETAILED DESCRIPTION OF THE PREFERRED EMBODIMENTS

In the following description, numerous specific details are set forth to provide a thorough understanding of the invention. However, it is understood that the invention may be practiced without these specific details. In other instances, well-known structures or and/or processes have not been described or shown in detail in order not to obscure the invention. In the description and drawings, like numerals refer to like structures or processes. The operation of a CAM device is well known in the art and will not be described further except where necessary to clarify aspects of the invention.

Figure 1:
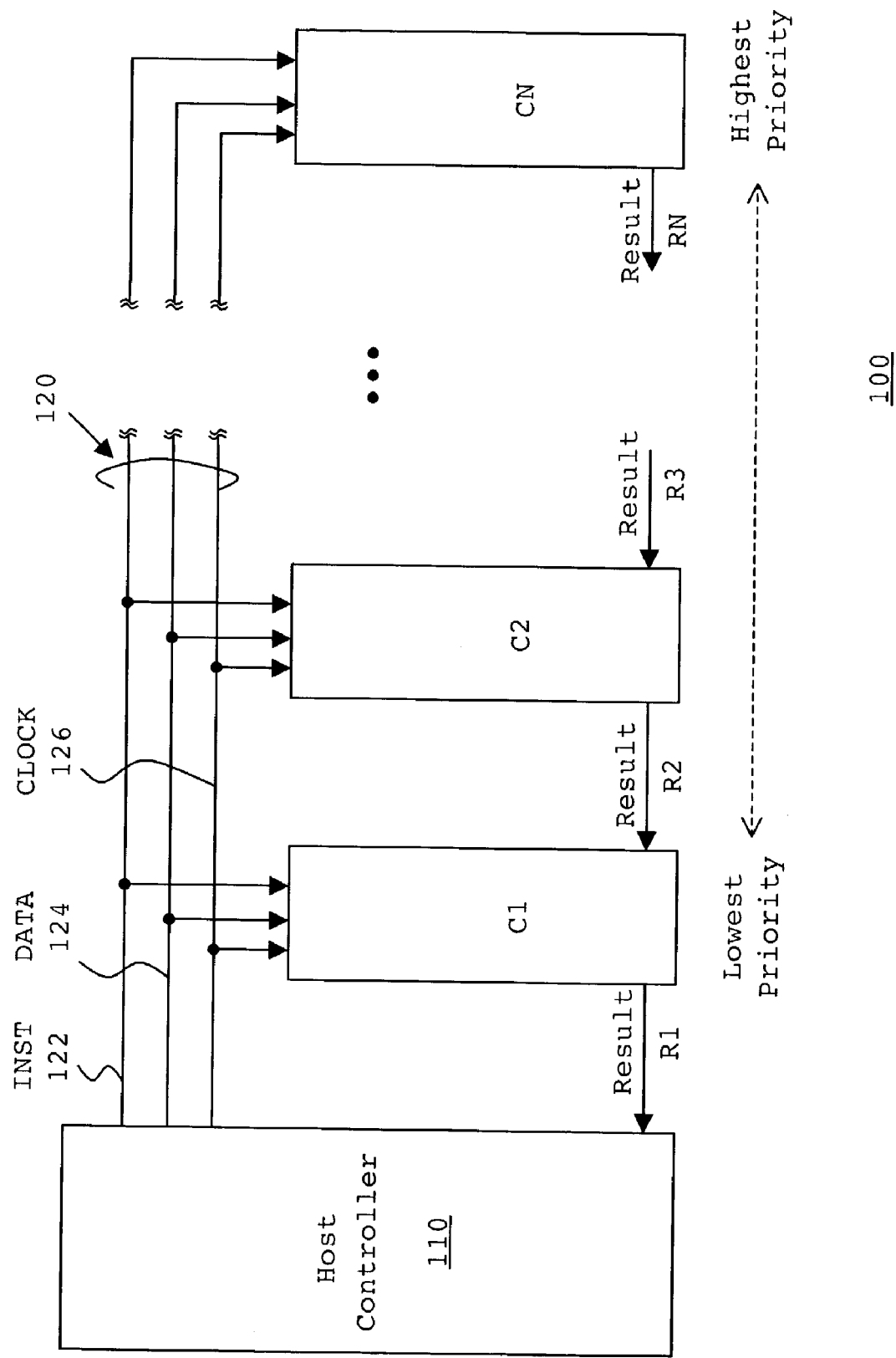
FIG. 1 is a schematic diagram of a daisy chain cascading method according to the prior art.

Referring to FIG. 1 there is shown a conventional daisy chain CAM cascading configuration 100 according to the prior art. The system 100 includes a host controller 110, common forwarding buses 120 and a plurality of CAMs Ci, i=1 to N, where N is the number of CAM's arranged sequentially and connected to the common forwarding buses 120. The forwarding buses include an instruction bus 122, a data bus 124 to receive commands issued with a corresponding search data key and a common clock signal line 126 to synchronize data transfer between the CAMs C1–CN with the host controller 110. A common result bus is not used; rather, results R1 from respective CAMs are propagated to adjacent CAMs in the chain until the first CAM C1 in the chain propagates a final result R1 to the host controller 110.

Priority for each CAM Ci is determined by its position in the chain relative to the host controller 110. Generally, the first CAM C1 in the chain has the lowest priority while the last CAM CN in the chain has the highest priority. Therefore the lowest priority CAM C1 is generally located closest to the host controller 110 and has its output result R1 coupled directly to the host controller 110.

Search command and search data key signals are applied to the forwarding buses 120 from the host controller 110, and a search is initiated in all CAMs C1–CN in parallel. Once the highest priority CAM CN has completed its search operation, search results RN are fed back from the highest priority CAM CN to an adjacent lower priority CAM CN−1 in synchronization with the common clock signal. Except for the highest priority CAM in the chain, results are not sent back to the adjacent lower priority CAM until a result is received from an adjacent higher priority CAM. The associated output result signal generally includes a match address (MA), a match flag (MF) indicating that a match has occurred and a multiple match flag (MMF) when two or more matches have been found in the CAMs C1–CN.

EAch CAM includes circuitry such that if the CAMs receives an associated output result from an adjacent higher priority CAM having a match, that CAM relays the received output to the next adjacent lower priority CAM. If a multiple associated output feature is supported in the cascaded CAMs (referred to as multiple match burst output), each CAM having at least a match sends its result after it has ascertained that no associated output from a higher priority CAM exists.

Figure 2:
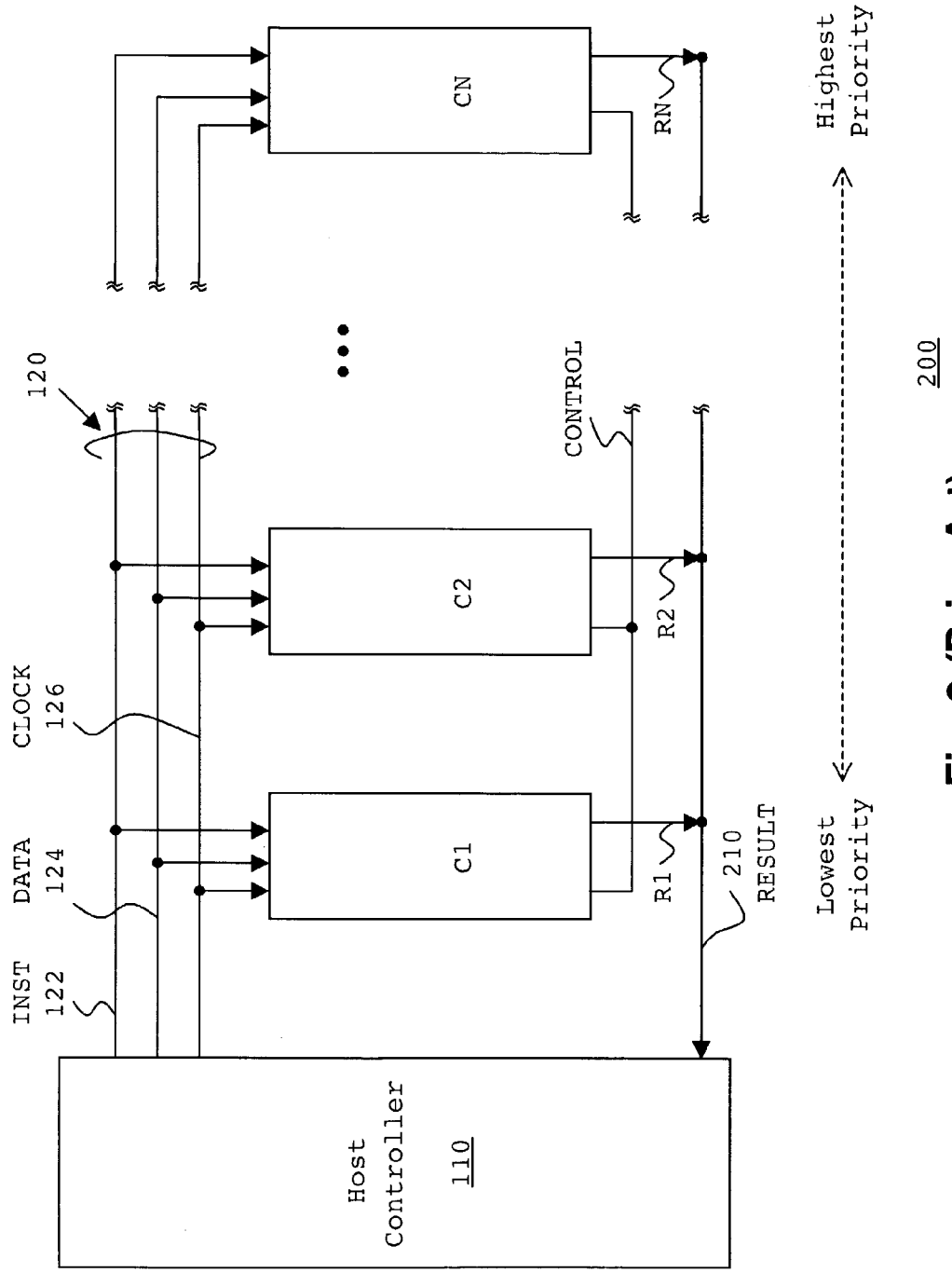
FIG. 2 is a schematic diagram of a multi-drop cascading method according to the prior art.

Referring now to FIG. 2, there is shown another conventional CAM cascading arrangement, specifically, a typical multi-drop cascade arrangement for a CAM system 200 is shown. In this arrangement the CAMs C1–CN are connected to common forwarding bus 120 in the same manner as that of the daisy chain method previously shown in FIG. 1. However, each associated output results R1 from each CAM Ci is coupled to the host controller 110 along a common result bus 210. A control signal CTRL is used to avoid contention between CAMs C1–CN transmitting their results simultaneously on the commonly connected result bus 210. If matches are found in several CAMs, only the highest priority CAM among them acquires the right to transmit its associated output on the commonly connected result bus 210. If the multiple match burst output feature is supported, then the next highest priority CAM acquires the right to access the bus and performs the same operation as in the higher priority CAM. This is repeated until the lowest priority CAM finishes transmitting its associated output to the host controller 110.

One objective of the present invention is to reduce load on forwarding buses in the cascading system, and thereby reduce delay time for signals propagated along the forwarding buses. An arrangement, according to an embodiment of the present invention, which achieves this objective, connects a host controller only to at least a first CAM, in a cascaded chain of CAMs. In turn, output and forwarding buses from the first CAM are connected to a second CAM. Output and forwarding buses from the second CAM are connected to a third CAM, and so on, up to a last CAM. The output from the last CAM is connected back to the host controller. Thus, the cascaded CAMs, of the present invention, do not share common forwarding buses, as in the prior art. Furthermore, unlike in the prior art, the CAM's in the cascaded chain of the present invention are arranged such that the lowest priority CAM in the chain returns the result to the controller and the higher priority match results are generally propagated to lower priority CAMs in the chain, thus reliance on additional circuitry to determine priority may not be required Although the above mentioned general description of one embodiment of the invention does address the problem of reducing load on buses in a CAM cascading arrangement, one drawback of the above arrangement is that the individual CAMs in the chain can lose synchronisation with the host controller as data and clock signals flow down the cascade chain. Several methods to resolve this problem are also described in the following embodiments of the invention.

Figure 3:
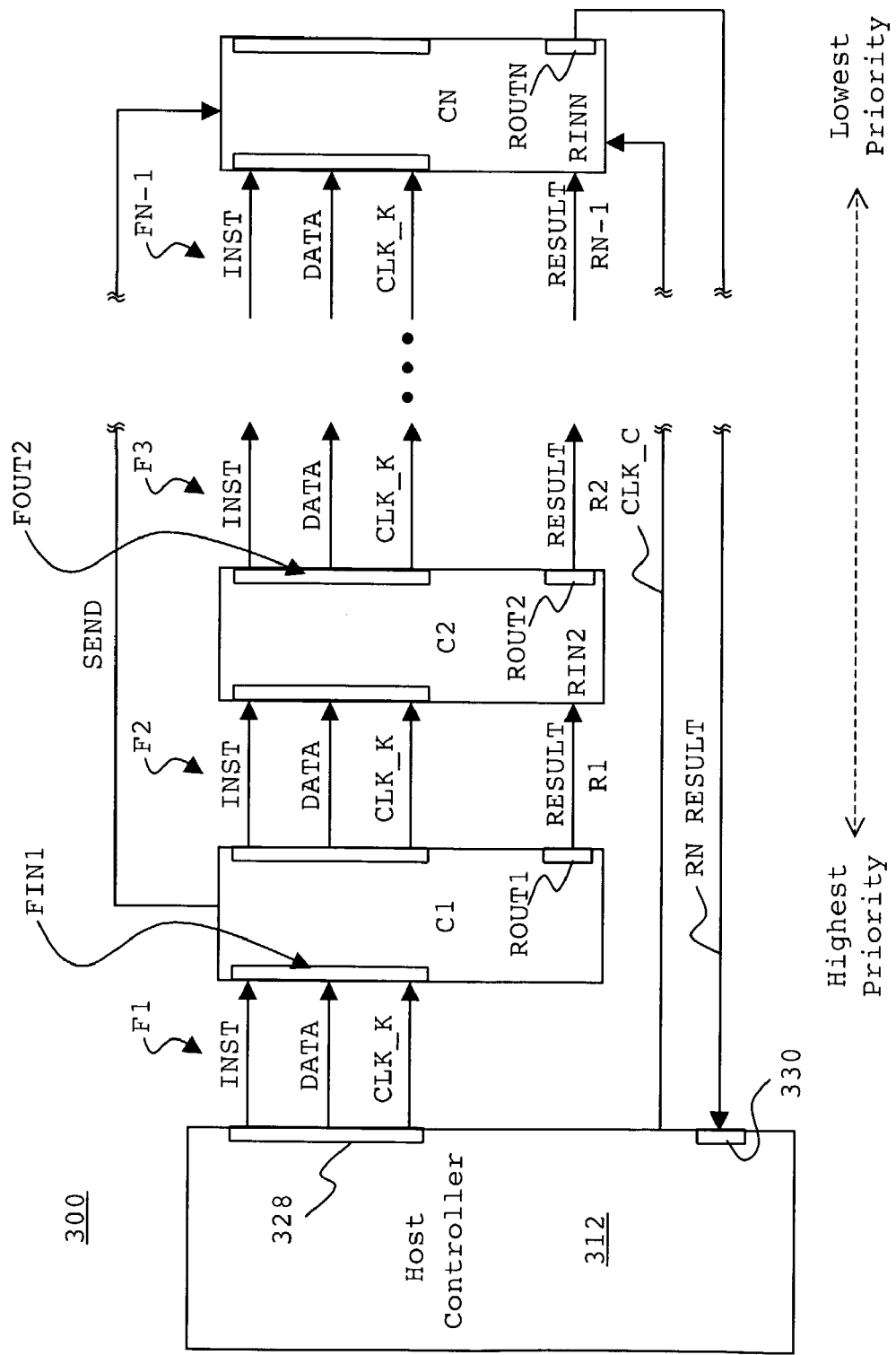
FIG. 3 is a schematic diagram showing a plurality of CAMs cascaded according to an embodiment of the present invention.

Referring now to FIG. 3 there is shown a schematic diagram of a CAM system 300 according to an embodiment of the present invention. The system includes a plurality of CAM devices C1–CN cascaded with a host controller 312 and a plurality of forwarding buses F1 to FN−1, once again where N is the number of CAMS in the cascade. Each forwarding bus Fi includes an instruction bus, a data bus and a clock bus for carrying corresponding instruction signals INST, data signals DATA and clock signals CLK_K respectively. Each of CAM devices Ci include bus input terminals FINi for receiving signals from a higher priority (or upstream) forwarding bus, and bus output terminals FOUTi for relaying signals to a lower priority (or downstream) forwarding bus Fi+1; and result input terminals RINTi for receiving an input match result signal from an upstream CAM and result output terminals ROUTi for transmitting an output match result RESULT to a downstream CAM (or host controller 312 if it is the last CAM in the cascade). The host controller 312 includes bus output terminals 328 for connection to a forwarding bus and result input terminals 330 for receiving a final match result. In this embodiment the bus output terminals 328 of the host controller 312 are connected by a first forwarding bus F1 to the bus input terminals FIN1 of a first CAM C1. A second forwarding bus F2, in turn, connects the output bus terminals FOUT of the first CAM C1 to the input bus terminals FIN2 of a second CAM C2. This type of connection is repeated for respective successive forwarding buses F3 to FN−1 and CAMs C3 to CN−1. In a similar manner, the result output terminal ROUT1 of the first CAM C1 is connected to the result input terminal RIN2 of the second CAM C2, the result output ROUT2 of the second CAM C2 is connected to the result input RIN2 of the third CAM C3 and so forth up to the last CAM CN. The last CAM CN has its associated result output terminal ROUTN connected to the corresponding input terminal 330 on the host controller 312 via the result bus. Finally a send signal SEND is generated by an enable signal generator in the first CAM C1 and is coupled to the last CAM CN to initiate transfer of the final search result to the host controller. Timing of when the send signal is generated is described later.

In summary it may be seen that instruction signals INST, data signals DATA and a clock signals CLK are only coupled via a short forwarding bus from the host controller to the first CAM C1. Signals between successive CAMs are also coupled via their respective short forwarding buses Fi. The short forwarding buses reduce the effect of delay of the signals along these buses, compared to the longer forwarding bus configuration as in the prior art.

The timing operation of the cascade arrangement of FIG. 3 will now be discussed. A send signal SEND is supplied from the first CAM C1 to the last CAM CN for synchronising transfer of the final search result RN from the last CAM CN to the host controller 312 after a predetermined number of clock cycles. The number of clock cycles before the SEND signal is asserted, is stored in a configuration register (not shown) in the first CAM C1. A user sets this register value, dependent on the number of cascaded CAMs and operating frequency of the system. When the first CAM C1 completes its search operation and the configured number of clock cycles pass, the SEND signal is asserted. This SEND signal indicates to the last CAM CN that the final output search result ROUTN should be driven to the host controller 312.

An additional controller clock signal CLK_C is generated by the host controller 312 for synchronising the result output from the last CAM CN to the host controller. The CAM CN forwards a final associated output to the host controller 312 synchronized to the clock signal CLK_C. The clock CLK_C controls output data registers in the last CAM CN and provides a reference clock to time the final associated output from the last CAM CN back to the host controller 312.

A conventional First In First Out (FIFO) register stack may be used to implement output data registers in the cascade chain to synchronize output results with the host controller 312. This is explained as follows. Data forwarded from CAM Ci in the cascade chain is stored in output data registers in the last CAM CN clocked by the clock signal CLK_Ki, and a final associated output from the CAM CN is forwarded to the host controller 312, clocked by the clock signal CLK_C provided by the host controller 312. An input pointer register indicates where to write outputs from the previous CAMs into the FIFO registers and an output pointer register indicates where to retrieve the outputs from the FIFO registers. Every time the last CAM CN receives a new associated output from the other cascaded CAMs, the value of the input pointer is changed and the corresponding associated output is stored in a register indicated by the input pointer. The FIFO mechanism allows the host controller 312 to read data synchronously and also allows the CAMs in the cascade to transmit and receive asynchronous data, clock and result signals. The FIFO mechanism is well known to those skilled in the art and will not be described further.

In addition, the clock signal CLK_K supplied from the host controller 312 is propagated through all CAMs C1–CN in the cascade chain, allowing each CAM C1–CN to function as an individual stage in a pipelined scheme. The clock is supplied from a previously adjacent CAM Ci−1 in the pipeline and is output with a delay corresponding to the latency of that CAM Ci. The delayed clock is then forwarded to the subsequent adjacent CAM Ci+1.

The priority of each CAM and their arrangement in this embodiment of the invention is different than that in the prior art. The first CAM C1 in the cascade chain is set as the CAM having the highest priority when the cascade chain returns result outputs. Each CAM C1–CN has its priority determined by its placement within the chain, relative to the host controller 312. A CAM Ci that is placed further from the host controller 312 has a lower priority.

Once the first CAM C1 receives a search command with a search key, a search operation is performed and an associated output search result R1 comprising a match address, a match flag and a multiple match flag is forwarded to the next connected CAM, in this example CAM C2. Generally the search results that are passed from the first CAM to subsequent intermediate CAMs in the cascade are intermediate search results and the final search result is returned to the controller from the lowest priority (or last CAM in the cascade).

Figure 4:
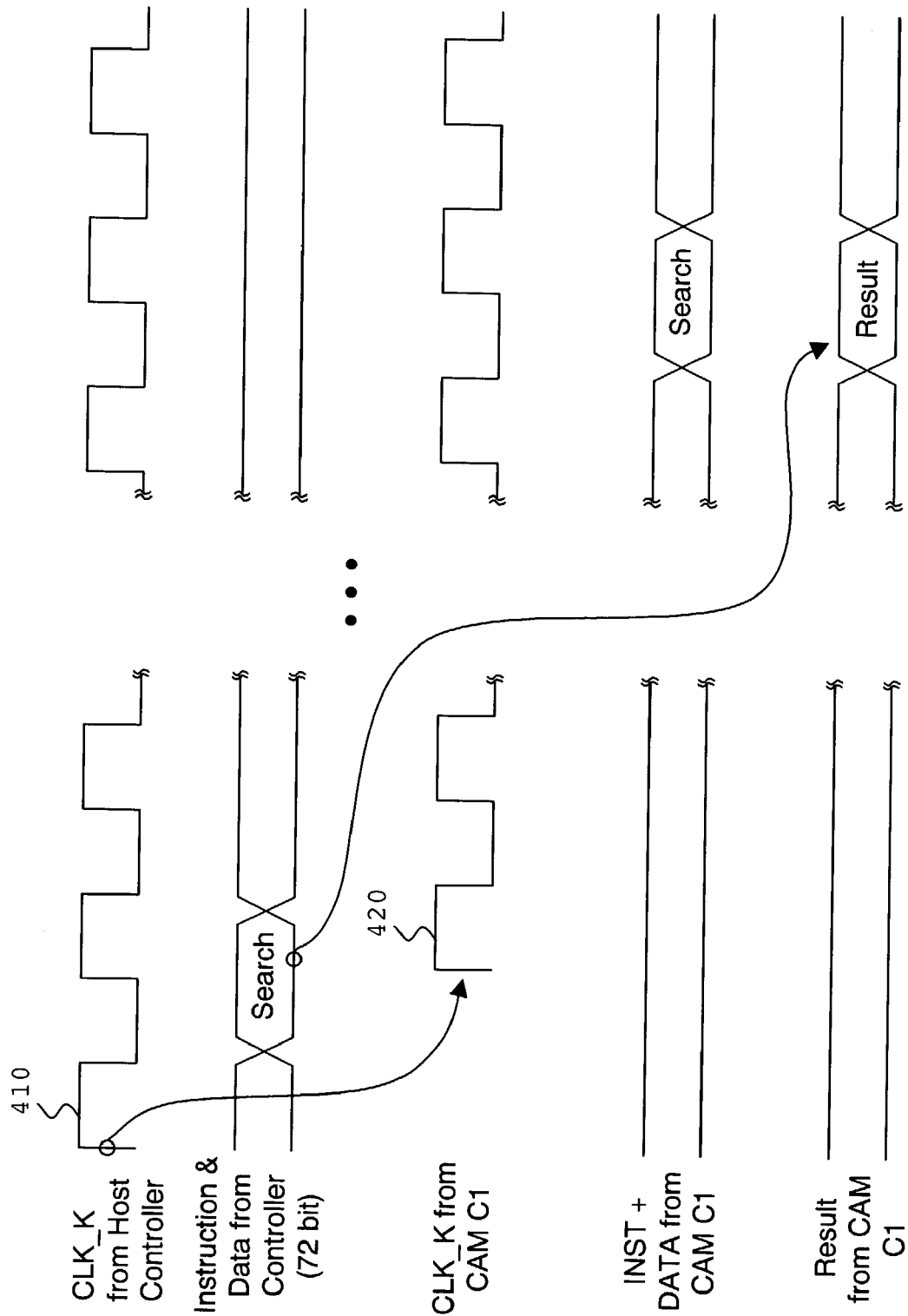
FIG. 4 is a diagram showing the timing signals for the cascaded arrangement of FIG. 3.

Referring to FIG. 4, a timing diagram 400 is shown for operations performed in the first CAM C1 in the cascade chain, which further illustrates the principles of operation of the cascading configuration discussed with reference to FIG. 3. For simplicity, only the operations of the first CAM C1 are shown. FIG. 4 shows several cycles of the clock signal CLK_K 410 supplied from the host controller 312 and a corresponding delayed clock signal CLK_K 420 output from the CAM C1. Once the first CAM C1 receives a search command with the search key, a search operation is performed and it takes several clock cycles, dependent on CAM search capability, to provide an associated output result. The search command with the search key and the associated output result from the CAM C1 are forwarded to the second CAM C2. It has to be noted that the initial search keys and the forwarded search key contains the same information. It should be noted that the CLK_K signal 410 is continuously propagated through the cascaded CAMs with the delay of each CAM being added to the output clock signal, and the associated output result and the search command with a search key are forwarded after several clock cycles as mentioned.

After the first CAM C1 provides the search command with the search key and an associated output result to the subsequent CAM C2, the second CAM C2 starts the search operation. The search operations in remaining CAMs are performed in subsequent CAMs until the last CAM, CAM CN, finishes the search operation and the CAM CN provides a final associated output to the host controller synchronised with the CLK_C signal. If there are multiple matches in individual CAM devices in the cascade chain, multiple match burst output may be achievable, but may be limited to the number of registers available for storing associated outputs from the CAMs.

Figure 8A:
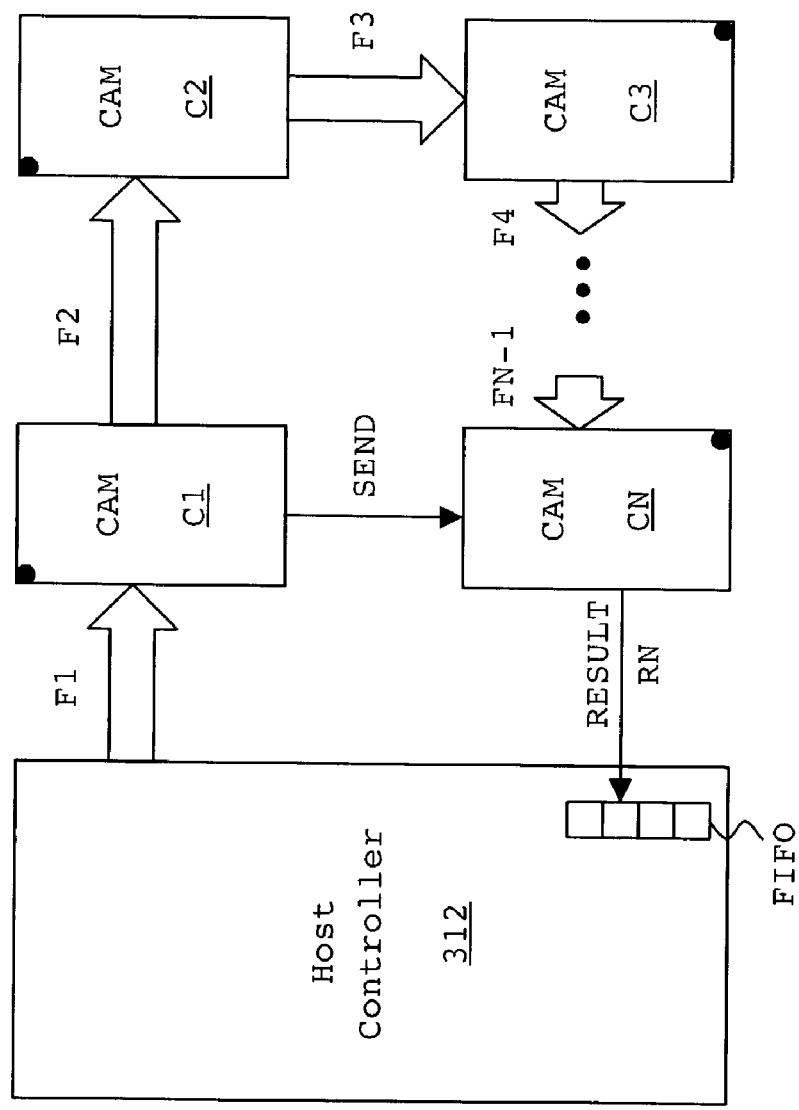
FIGS. 8a and 8b are schematic diagrams showing an output arrangement for the CAM system.

By placing the CAMs in a "ring" formation, it is possible to minimize the physical distances between first and last CAMs and the host controller. FIG. 8a shows how the first CAM C1 and the last CAM CN are physically placed close to the host controller.

As mentioned earlier, individual CAMs in the chain may lose synchronization with the host controller as data and clock signals flow down the cascade. Therefore, a mechanism is required to accurately set the latency across individual CAM devices. One solution to this is described below.

For ease of explanation a single clock signal line has been shown in the above diagrams, however in practice most CAM devices operate as double data rate (DDR) devices using a pair of complementary clock signals to sample data results. In the following description of the timing system DDR clocks will be illustrated. The clocks follow respective complementary clock paths A and B.

Figure 5:
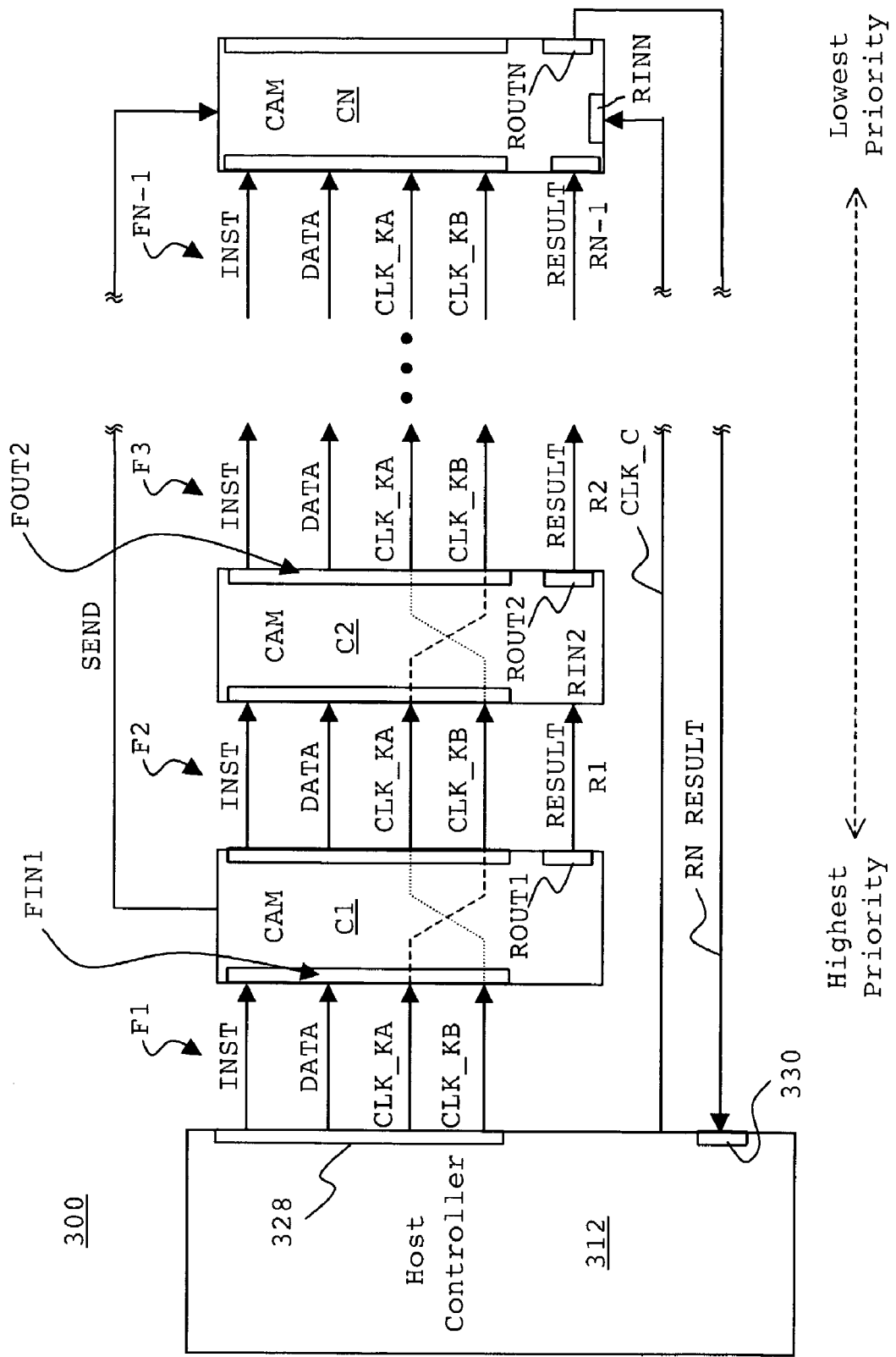
FIG. 5 is schematic diagrams of a circuit for minimising clock skew in a CAM device according to an embodiment of the present invention.

Since clock signals flow asynchronously through the chain it is important that the edges of the complimentary clocks do not drift with respect to each other. This clock drift is generally caused by production variability. For example, if the first CAM device was produced in a first wafer lot and a second CAM device was produced in a second wave lot, it may be that clock path A is faster than clock path B for the CAMS produced from the first wafer lot and vice versa for the CAMS from the second wafer lot. One solution to this problem is to cross the clock signal paths flowing from the input clock pin to the output clock pin of the CAM device. This is shown schematically in FIG. 5.

In addition to ensuring that the complimentary clock edges do not drift with respect to each other, it is important that instructions and data are relayed through a CAM device with an accurately defined latency, particularly if the CAM devices operate at a relatively high speed, such as at speeds in excess of 200 MHz.

Figure 6:
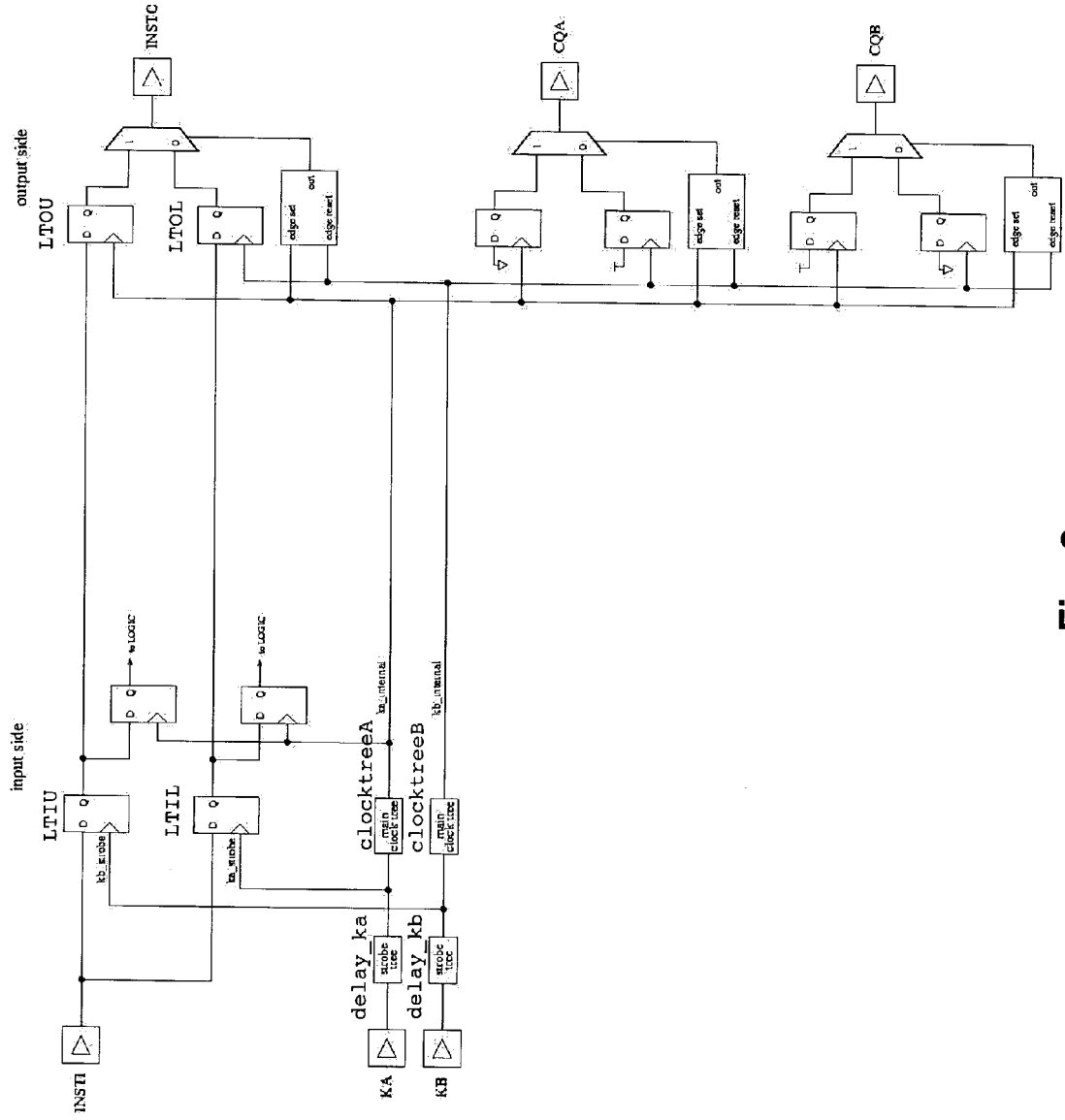
FIG. 6 is a schematic diagram of a circuit for determining data flow latency through a CAM device according to an embodiment of the present invention.

Referring now to FIG. 6 there is shown a timing system for accurately determining the latency of data flow through a CAM device according to an embodiment of the present invention. For clarity, the timing system is illustrated for a single bit of instruction data INSTI. It is understood that the circuit would be replicated for each additional bit of instruction data INSTI.

The timing circuit includes input and output buffers coupled from respective input and output pins of the CAM device. Complimentary clock signals KA, KB, are coupled from their respective input pins to a process-independent delay element (that is, a delay element designed to exhibit insignificant variations in its delay based on device fabrication process variations) delay_ka and delay_kb to produce respective delayed clock signals ka_strobe and kb_strobe, which in turn are fed to the clock inputs of respective input-side D-latches LTIU and LTIL which receive at their respective D-inputs the input instruction signal INSTI. The Q outputs from the latches LTIU and LTIL are coupled to respective D-inputs of output-side latches LTOU, LTOL. The output latches LTOU and LTOL, are clocked by a delayed version (ka_internal and kb_internal) of the ka_strobe and kb_strobe clock signals. That is, additional delay elements clocktreeA and clocktreeB delay the respective ka_strobe kb_strobe signals. The Q outputs of the output latches LTOU, LTOL, are combined by a multiplexer and driven to an output pin as the The delay elements clocktreeA and clocktreeB are chosen to provide a relatively small delay, so as to allow for the settling time of logic transitions on the input signal INSTI. The clocktreeA and clocktreeB delay elements are chosen so that the edges of the ka_internal and kb_internal signals occur approximately in the middle of the instruction signal INSTI period, and preferably, to occur approximately in a first quarter of the INSTI period. For achieving more accurate timing delays, particularly if the CAMs are needed to perform at higher speeds, well known circuits, such as a delay lock loop (DLL) or a phase lock loop (PLL), can be implemented as long as the delayed KA and KB signal they produce, assures that the input instruction signal INSTI is ready to be latched properly. However, using a DLL or PLL to synchornize internal clocking requires a more complex system and very tight control of the quality of the fabrication process used to manufacture the each CAM device. The circuit illustrated in FIG. 6 allows for accurate timing control without requiring the added overhead of implementing an on-chip DLL or PLL.

Thus, the delay time existing between the input instruction signal INSTI arriving to a chip, being transferred through the chip and set to be available in the output of the chip (INSTO), including the time it takes the signal to be available as the instruction signal INSTI to the following chip is determined by a the following latency equation (in nanoseconds): [½tclock+tKHEH+board delay]. Wherein tclock is the time of a clock cycle, tKHEH is the minimum and maximum delay provided by the analog delay element, and the board delay is the time that it takes to the signal to travel through the board and to the next chip. For example, if the system is operating at 166 MHz, the tclock=6 ns. For a particular memory tested, the minimum and maximum analog delay tKHEH is between 3 and 6 ns and the board delay is the average interdevice routing delay, approximately between 0 and 1 ns, the total delay for propagating the instruction signal is between 6 and 10 ns.

In addition, the internal delayed clock signals Ka_internal and Kb_internal are also passed through output D-type flip-flops to generate output clock signals CQA and CQB which are delayed versions of the input clock signals. As there are two clock signals KA and KB, two pairs of flip-flops are used and once again the outputs from each pair of flip-flops is combined in a respective multiplexer to generate the respective CQA and CQB clock signals.

Figure 7:
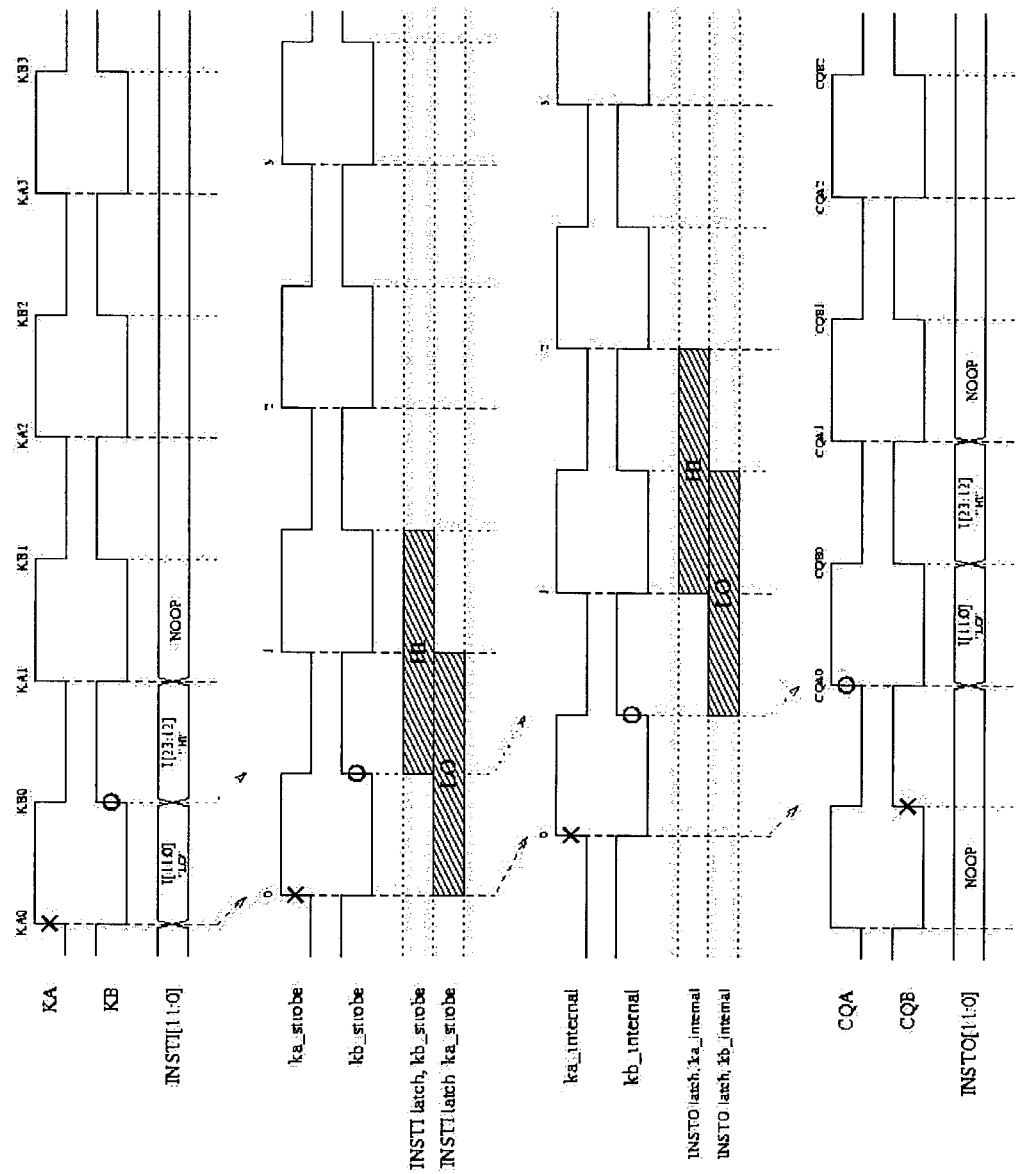
FIG. 7 is a timing diagram for the system of FIG. 6.

Referring to FIG. 7 there is shown a timing diagram showing the flow of signals through the timing circuit of FIG. 6. It may be seen that the output signals, in this case, INSTO and the output clock signals CQA and CQB are latched out of the CAM device at the same time since they are clocked out by the same delayed internal clock signals ka_internal and kb_internal, respectively. Accordingly, this timing mechanism ensures that edges of the data signals and clock signals do not drift with the successive devices are added to the cascade.

As mentioned earlier, a FIFO may be used to implement an output data register in the cascade chain to synchronize output results with the host controller 312. Accordingly, referring to FIGS. 8*a* and 8*b*, two modes are shown in which the FIFO may be used to synchronize output results with the host controller. In FIG. 8*a*, a "K-mode" implementation is shown. In the "K-mode" implementation, the FIFO is implemented in the host controller and a programmable register in the first CAM device is used to store the number of clock cycles that the first CAM should wait before the last CAM is ready to send its results to the host controller. This programmable value, called CLAT, depends on the number of devices in the cascade. In this mode, the first CAM simply asserts the send signal to the last CAM after the programmed number of clock cycles has passed.

Figure 8B:
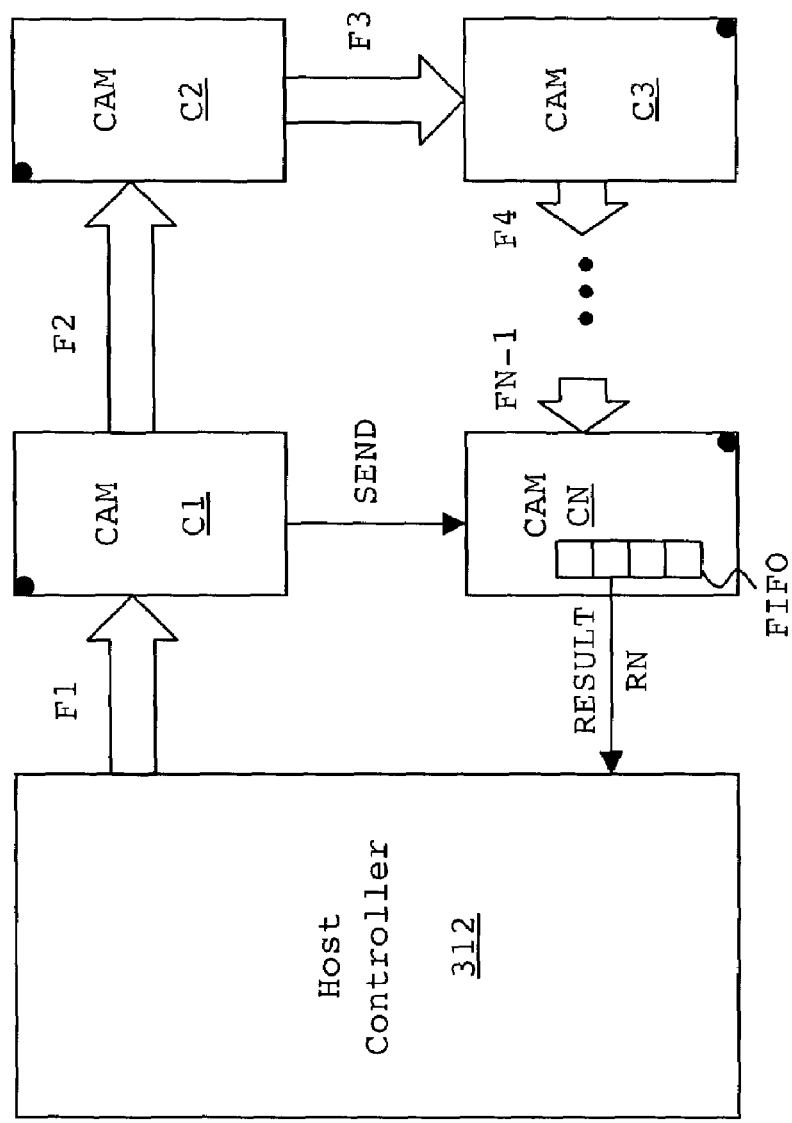

In FIG. 8*b*, the "C-mode" arrangement is shown. In this arrangement the FIFO is contained in the last CAM device and the complimentary clock signals KA, KB to the first CAM also coupled to the last CAM. In this case, the CLAT register is programmed as previously with the number of clock cycles, however, the FIFO is clocked directly from the clock signal KA, KB. In this instance, the user does not have to create a FIFO in the host controller. Thus, the timing and forwarding of results from the last CAM is completely transparent to the user.

Figure 9:
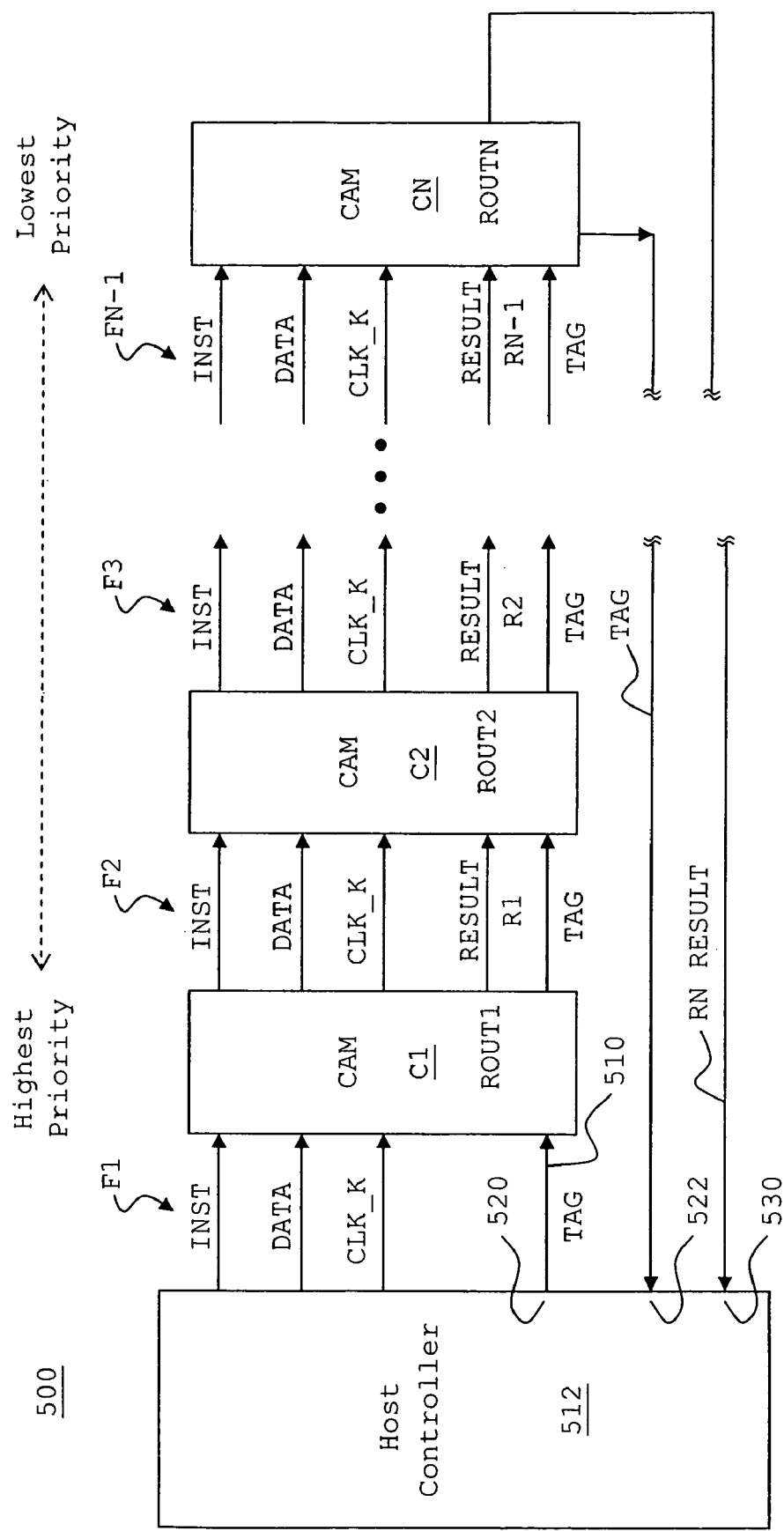
FIG. 9 is a schematic diagram of showing a plurality of CAMs cascaded according to a second embodiment of the present invention.

Referring to FIG. 9 there is shown a schematic diagram of a CAM system 500 according to a second embodiment of the present invention. In this system 500, the configuration of CAMs in the cascaded chain is similar to FIG. 3 except that the clock CLKC_signal to the last CAM CN and a SEND signal between the first and last CAMs C1 and CN respectively, are not used. As described above, it is difficult for the host controller 512 to know the number of clock cycles before a final result is obtained from the cascaded chain. Accordingly, in this embodiment, in order to signal to the host controller 512 that a final result is available from the last CAM CN in the cascade chain, a tag signal TAG 510 is introduced in the chain. The tag is transmitted from the host controller 512, which uses the tag signal 510 to locate the corresponding search command that was issued to the first CAM C1. The host controller includes tag output terminal 520 and tag input terminal 522. Essentially, the tag signal is an identification signal that is asserted in parallel with and simultaneously with search command and search data results from a higher priority CAM to an adjacent lower priority CAM. Upon receiving the tag with a final associated output result RN from the last CAM CN, the host controller 512 recognizes which search command corresponds to the received final associated output and proceeds to the next operations with the final result RN.

Figure 10:
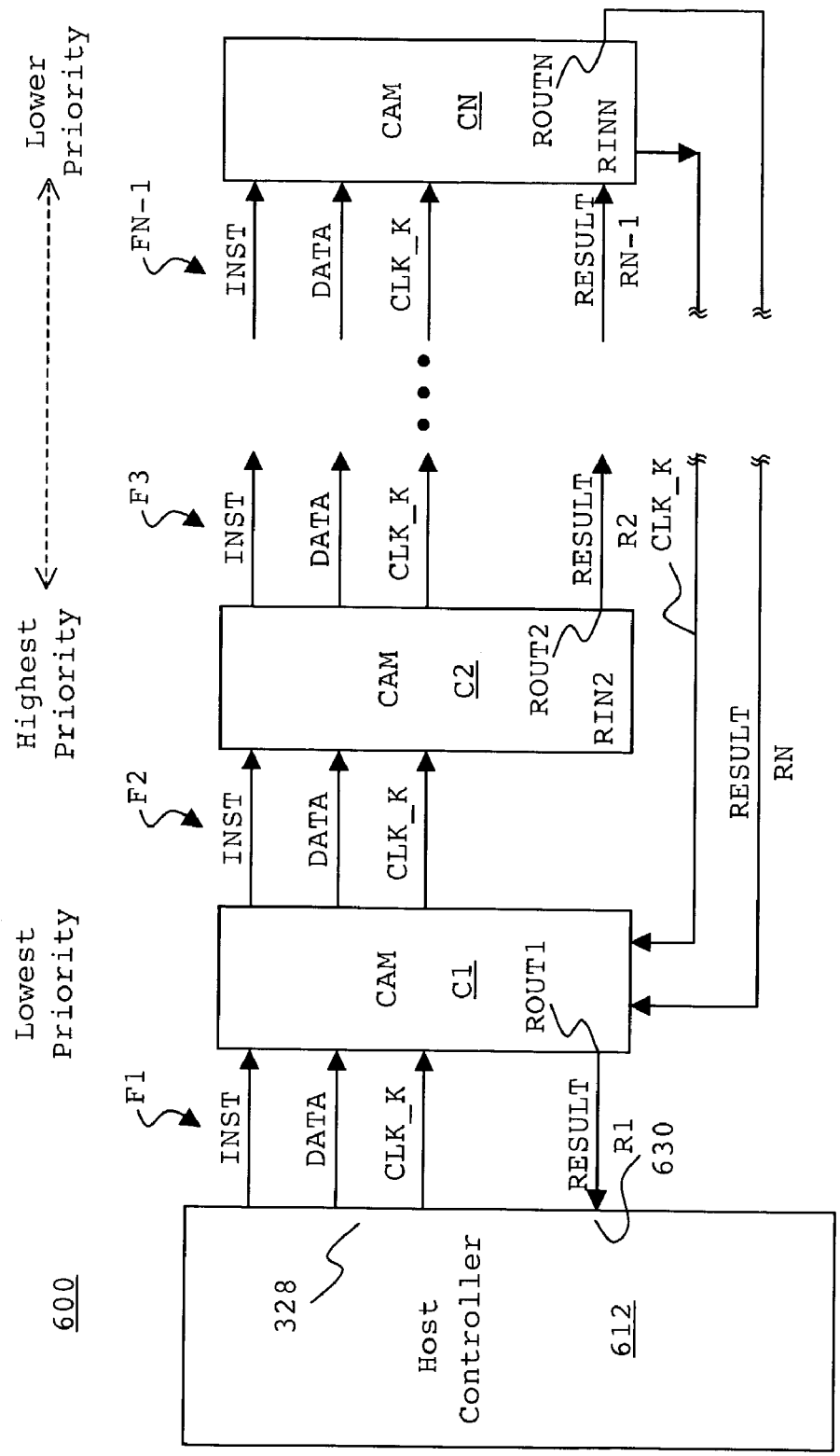
FIG. 10 is a schematic diagram of showing a plurality of CAMs cascaded according to a third embodiment of the present invention.

Referring to FIG. 10 there is shown a cascaded CAM system 600 according to a third embodiment of the invention. In this embodiment the lowest priority CAM C1 is physically placed in the closest position to a host controller 612. The host controller 612 provides a search command with a search key and the clock CLK_K signal to the closest CAM C1 having the lowest priority. A delayed clock signal from CAM Ci is provided to an adjacent CAM Ci+1 throughout the cascaded chain as described in previous embodiments. The closest CAM performs a search operation and forwards the search command with the key without its associated output to an adjacent second CAM C2. In the present embodiment, the second adjacent CAM C2 is the CAM that has the highest priority. The second CAM C2 forwards a search command with a key and an associated output to the next adjacent CAM C3 after a search operation is completed. An associated output result RN and a delayed clock CLK_K signal from the last CAM CN are provided to the first CAM C1. Finally the first CAM C1 provides a final associated result output R1 to the host controller 612. With this embodiment, it is unnecessary to provide the SEND signal from the first CAM C1 to the last CAM CN, as in the embodiment of FIG. 3 because the first CAM C1 is capable of computing the number of clocks taken through the cascade chain. The first CAM C1 receives a clock CLK_K signal from the host controller and a delayed clock signal CLK_K from the last CAM CN, respectively.

Figure 11:
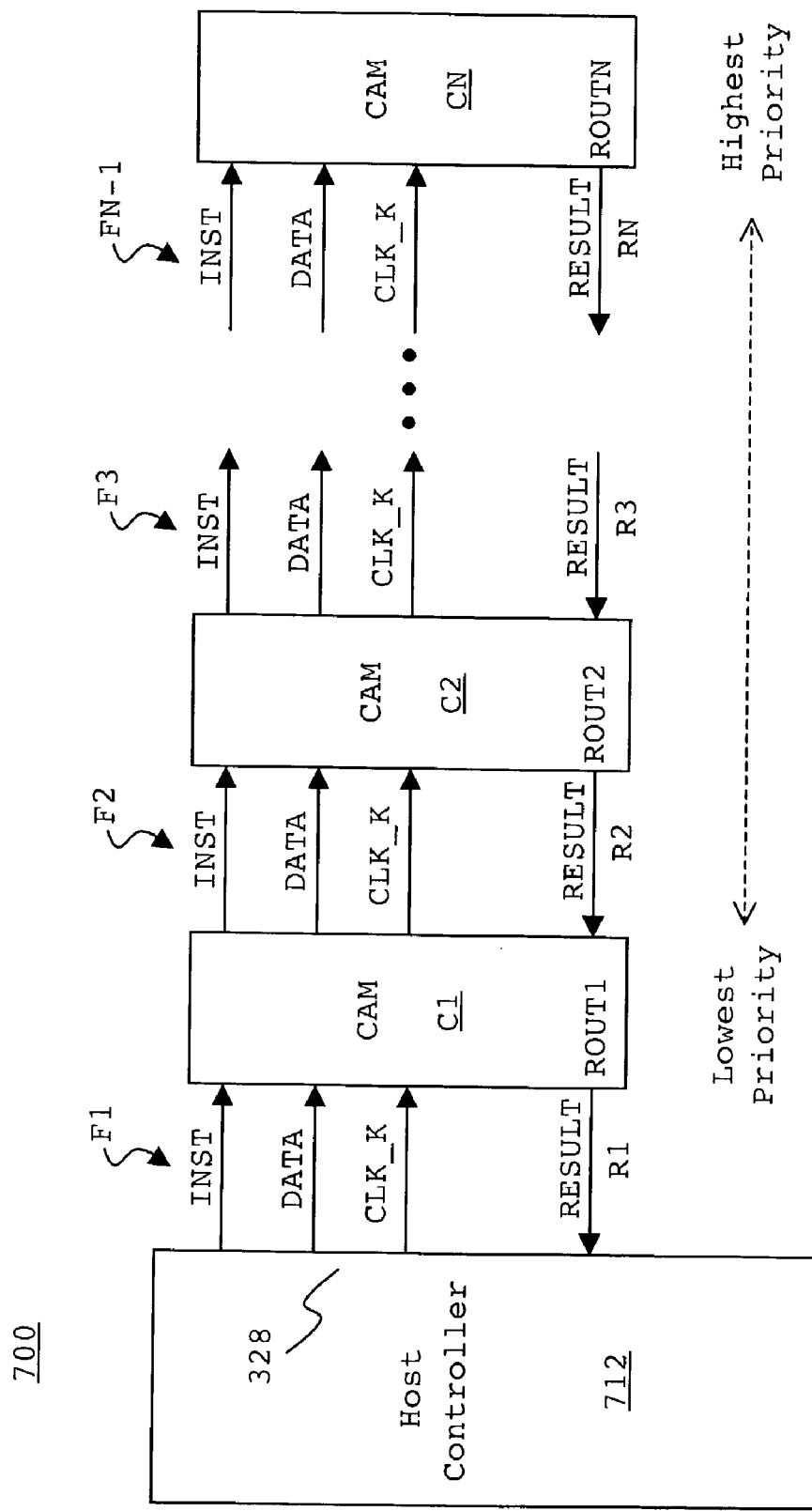
FIG. 11 is a schematic diagram of showing a plurality of CAMs cascaded according to a fourth embodiment of the present invention.

Referring to FIG. 11 there is shown cascaded CAM system 700 according to a fourth embodiment of the invention. While this embodiment may be the most transparent method to the host controller 712 and the easiest method to implement, it is somewhat slower than the embodiment described on FIG. 10 because of the added clock latency caused by each CAM in the cascade chain.

The CAMs in the cascade chain are arranged as shown in the embodiment of FIG. 3. However, a clock CLK_C signal and a result path between a host controller and the last CAM CN are obviated and a SEND signal is not provided from the first CAM C1, to the last CAM CN. A clock loop is established between a host controller 712 and all the CAMs C1–CN in the cascade chain. Priority setting of cascaded CAMs in the present embodiment is opposite to that shown in FIG. 3. In FIG. 11, the first CAM C1 has the lowest priority and the last CAM CN has the highest priority. A search command with a key is issued by the host controller 712 to the first CAM C1 and a search operation in the first CAM starts. After its search operation is completed, the first CAM C1 forwards a search command with a key to the second CAM C2, while holding an associated output. Similarly, the second CAM C2 operation cascades along the CAMs in the chain, with each CAM holding its associated output. Once the search operation is completed by the last CAM CN, the associated output is provided as result RN from the last CAM CN is sent back to the previous adjacent CAM CN−1 and the associated result is subsequently sent backward through the cascade chain to the host controller 712 every clock cycle. If a match in a higher priority CAM is found, this result will prevail and will be sent through the remaining CAMs in the cascade, preventing the associated output of a lower priority CAM to be sent to the host controller 712. As previously mentioned, if there are multiple matches in CAMs in the cascade chain, multiple match burst output may be achievable. In this case, each CAM will combine the previous associated result with its own held search result and then send it to the following lower priority CAM until it reaches the host controller 712. In this embodiment, the host controller 712 always receives the result of the search from the first CAM C1. The host controller described in the teachings may be considered as microprocessor, micro-controller or ASIC based control chip. Even though a search operation in the cascade chain was described as an example of an operation performed in the CAM, a write operation or a read operation can be applied in the same way.

The invention is not limited to the cases having three CAMs as shown, any number of CAMs may be arranged in the cascade chain, according to the present invention, as long as delay time for system requirement is met.

Although preferred embodiments of the invention have been described herein, it will be understood by those skilled in the art that variations may be made thereto without departing from the spirit of the invention or the scope of the appended claims.

The embodiments of the invention in which an exclusive property or privilege is claimed are defined as follows:

1. A cascaded content addressable memory (CAM) apparatus, comprising:
    a host controller;
    a plurality of n CAM devices; and
    a plurality of forwarding buses for coupling a first CAM in the plurality of N CAM devices to the host controller and coupling the first CAM to a second through Nth CAM devices to form a cascade chain of CAM devices, each of the first through Nth CAM devices being coupled via one of the plurality of forwarding buses, the forwarding bus comprising an instruction bus, a data bus and a clock bus for carrying a pair of complimentary clock signals,
    wherein the first CAM device comprises means for supplying a SEND signal to the Nth CAM device, the SEND signal enabling transfer of a final search result from the Nth CAM device to the host controller.

2. The cascaded CAM apparatus of claim 1, wherein the CAM devices are positioned in a formation to minimize physical distances between the CAM devices and the host controller.

3. The cascaded CAM apparatus of claim 2, wherein the first CAM device and the Nth CAM device are positioned proximate to the host controller.

4. The cascaded CAM apparatus of claim 1, wherein the pair of complementary clock signals follow a signal path through the CAM devices that is crossed over in each successive CAM device.

5. The cascaded CAM apparatus of claim 4, wherein each of the first through Nth CAM devices comprises a timing circuit for receiving the pair of complimentary clock signals and for generating and outputting a delayed version of the pair of complimentary clock signals to the next forwarding bus.

6. The cascaded CAM apparatus of claim 1, wherein each of the first through Nth CAM devices are coupled via a result bus, the result bus forwarding a search result from each CAM device to the next CAM device in the cascade chain.

7. A content addressable memory (CAM) system, comprising:
   a plurality of CAM devices connected in a serial cascade arrangement, the CAM devices in the cascade being connected to adjacent CAM devices by a forwarding bus, with at most a first CAM in the cascade being connected to receive data signals from a host controller and at most a last CAM device being coupled to forward results back to the host controller; and
   a send signal generator for supplying a SEND signal to the last CAM device, the SEND signal co-ordinating transfer of the search result from the last CAM to the host controller.

8. A method for searching a cascaded plurality of memory devices, each memory device being capable of performing an search operation, the method comprising:
   receiving a search instruction and a search data key in a first memory device;
   initiating a first search operation in the first memory device;
   forwarding the search instruction and the search data key to a subsequent memory device in the cascaded plurality of memory devices;
   in turn, initiating a search operation in each subsequent memory device, each time forwarding the search instruction and the search data key on to a subsequent memory device in the cascaded plurality of memory devices up to a last memory device;
   generating a search result for each search operation in a memory device that yields one or more matches with the search data key;
   forwarding the search result in turn to each subsequent memory device in the cascaded plurality of memory devices up to the last memory device;
   comparing the forwarded search result with a search result from a search operation in a memory device to generate a search result for forwarding to a subsequent memory device; and
   forwarding a final search result from the last memory device to a host controller on receipt of a SEND signal from the first memory device.

9. The method of claim 8, wherein for each memory device the forwarding of the search instruction and search data key occurs on completion of the search operation in the memory device.

10. The method of claim 8, wherein the search result comprises a memory address.

11. The method of claim 8, wherein the search result comprises a plurality of memory addresses.

12. The method of claim 8, further comprising assigning a priority to each memory device.

13. The method of claim 12, wherein the step of assigning a priority comprises assigning a highest priority to the first memory device; and a decreasing priority to each subsequent memory device.

14. The method of claim 12, wherein the step of assigning a priority comprises assigning a lowest priority to the first memory device, a highest priority to a second memory device and a decreasing priority to each subsequent memory device.

15. The method of claim 12, wherein the step of assigning a priority comprises assigning a lowest priority to the first memory device an increasing priority to each subsequent memory device.

16. The method of claim 12, wherein the step of comparing is performed on the basis of a priority assigned to the each memory device in the cascaded plurality of memory devices.

17. The method of claim 16, wherein the search result for forwarding to a subsequent memory device is a search result originating from the memory device having a higher assigned priority.

18. The method of claim 15, wherein the search result is forwarded in turn to each previous memory device in the cascaded plurality of memory devices up to the first memory device and the first memory device forwards the search result to the host controller.

19. A method for searching a cascaded plurality of memory devices, each memory device being capable of performing an search operation, the method comprising:
   receiving a search instruction and a search data key in a first memory device;
   initiating a first search operation in the first memory device;
   forwarding the search instruction and the search data key to a subsequent memory device in the cascaded plurality of memory devices;
   in turn, initiating a search operation in each subsequent memory device, each time forwarding the search instruction and the search data key on to a subsequent memory device in the cascaded plurality of memory devices up to a last memory device;
   generating a search result for each search operation in a memory device that yields one or more matches with the search data key;
   forwarding the search result in turn to each subsequent memory device in the cascaded plurality of memory devices up to the last memory device;
   comparing the forwarded search result with a search result from a search operation in a memory device to generate a search result for forwarding to a subsequent memory device;
   forwarding a final search result form the last memory device to a host controller; and
   receiving a clock signal from the host controller for synchronizing the forwarding of the final search result to the host controller.

20. The method of claim 19, wherein for each memory device the forwarding of the search instruction and search data key occurs on completion of the search operation in the memory device.

21. The method of claim 19, wherein the search result comprises a memory address.

22. The method of claim 19, wherein the search result comprises a plurality of memory addresses.

23. The method of claim 19, further comprising assigning a priority to each memory device, the step of comparing being performed on the basis of a priority assigned to the each memory device in the cascaded plurality of memory devices.

24. The method of claim 19, wherein the search result comprises a memory address.

25. A method for searching a cascaded plurality of memory devices, each memory device being capable of performing an search operation, the method comprising:

receiving a search instruction and a search data key in a first memory device;

initiating a first search operation in the first memory device;

forwarding the search instruction and the search data key to a subsequent memory device in the cascaded plurality of memory devices;

in turn, initiating a search operation in each subsequent memory device, each time forwarding the search instruction and the search data key on to a subsequent memory device in the cascaded plurality of memory devices up to a last memory device;

generating a search result for each search operation in a memory device that yields one or more matches with the search data key;

forwarding the search result in turn to each subsequent memory device in the cascaded plurality of memory devices up to the last memory device;

comparing the forwarded search result with a search result from a search operation in a memory device to generate a search result for forwarding to a subsequent memory device;

generating a tag in a host controller, the tag indicating a correspondence with a particular search instruction;

forwarding the tag to the first memory device;

subsequently forwarding the tag along with the forwarded search result to subsequent memory devices in the cascaded plurality of memory devices; and forwarding a final search result from the last memory device to the host controller.

26. The method of claim 25, further comprising forwarding the tag along with the final search result to the host controller.

27. The method of claim 25, wherein for each memory device the forwarding of the search instruction and search data key occurs on completion of the search operation in the memory device.

28. The method of claim 25, wherein the search result comprises a memory address.

29. The method of claim 25, wherein the search result comprises a plurality of memory addresses.

30. The method of claim 25, further comprising assigning a priority to each memory device, the step of comparing being performed on the basis of a priority assigned to the each memory device in the cascaded plurality of memory devices.

31. A method for searching a cascaded plurality of memory devices, each memory device being capable of performing an search operation, the method comprising:

receiving a search instruction and a search data key in a first memory device;

initiating a first search operation in the first memory device;

forwarding the search instruction and the search data key to a subsequent memory device in the cascaded plurality of memory devices;

in turn, initiating a search operation in each subsequent memory device, each time forwarding the search instruction and the search data key on to a subsequent memory device in the cascaded plurality of memory devices up to a last memory device;

generating a search result for each search operation in a memory device that yields one or more matches with the search data key;

forwarding the search result in turn to each subsequent memory device in the cascaded plurality of memory devices up to the last memory device;

comparing the forwarded search result with a search result from a search operation in a memory device to generate a search result for forwarding to a subsequent memory device; and forwarding a search result from the last memory device to the first memory device and comparing the forwarded search result to a search result from a search operation in the first memory device to generate a final search result for forwarding to a host controller.

32. The method of claim 31, wherein for each memory device the forwarding of the search instruction and search data key occurs on completion of the search operation in the memory device.

\* \* \* \* \*